(12) United States Patent
Downes et al.

(10) Patent No.: US 7,252,100 B1
(45) Date of Patent: Aug. 7, 2007

(54) SYSTEMS AND METHODS FOR PROCESSING A SET OF CIRCUIT BOARDS

(75) Inventors: Stuart D. Downes, Milford, MA (US); Deborah Fragoza, Upton, MA (US); Eric Ren, Marlborough, MA (US); Thomas E. Knight, Hopkinton, MA (US)

(73) Assignee: EMC Corporation, Hopkinton, MA (US)

( * ) Notice: Subject to any disclaimer, the term of this patent is extended or adjusted under 35 U.S.C. 154(b) by 610 days.

(21) Appl. No.: 10/402,514

(22) Filed: Mar. 28, 2003

(51) Int. Cl.
*B08B 3/00* (2006.01)

(52) U.S. Cl. .................. 134/111; 134/56 R; 134/94.1; 134/98.1; 134/108; 134/103.2; 134/184; 134/199

(58) Field of Classification Search ........... 134/56 R, 134/57 R, 111, 103.2, 199, 125, 126, 94.1, 134/98.1, 108, 184
See application file for complete search history.

(56) References Cited

U.S. PATENT DOCUMENTS

| | | | | |
|---|---|---|---|---|
| 2,933,212 | A | * 4/1960 | Hauck | 414/564 |
| 3,429,786 | A | * 2/1969 | Kubik | 205/125 |
| 3,573,187 | A | * 3/1971 | Stakelbeck | 204/203 |
| 3,824,137 | A | * 7/1974 | Bok et al. | 216/92 |
| 3,945,388 | A | * 3/1976 | Clark | 134/57 R |
| 4,971,083 | A | * 11/1990 | Stach et al. | 134/57 R |
| 5,338,248 | A | * 8/1994 | Sumrack | 454/49 |
| 5,849,106 | A | 12/1998 | Bolden et al. | 134/40 |
| 5,861,076 | A | 1/1999 | Adlam et al. | 156/281 |
| 5,863,883 | A | 1/1999 | Yam et al. | 510/407 |
| 5,865,902 | A | 2/1999 | Yam et al. | 134/7 |
| 6,110,292 | A | 8/2000 | Jewett et al. | 134/1 |
| 6,161,560 | A | 12/2000 | Brink | 134/72 |
| 6,446,855 | B1 | 9/2002 | Rich | 228/19 |
| 6,511,549 | B1 | 1/2003 | Ercelebi et al. | 134/2 |
| 6,569,252 | B1 | 5/2003 | Sachdev et al. | 134/2 |
| 6,792,957 | B2 * | 9/2004 | Choi et al. | 134/61 |

FOREIGN PATENT DOCUMENTS

| | | | |
|---|---|---|---|
| JP | 56058999 | * | 5/1981 |
| JP | 56-108884 | * | 8/1981 |
| JP | 7-60208 | * | 3/1995 |
| JP | 7-241537 | * | 9/1995 |
| JP | WO 9528235 | * | 10/1995 |
| JP | 7-323265 | * | 12/1995 |
| JP | 2000-180052 | * | 6/2000 |

* cited by examiner

*Primary Examiner*—M. Kornakov
(74) *Attorney, Agent, or Firm*—BainwoodHuang

(57) ABSTRACT

A circuit board processing system includes a wash tank configured to contain cleaning fluid, and a positioning subsystem configured to immerse a set of circuit boards into the wash tank. The system further includes a flow control subsystem having (i) a first set of nozzles disposed within the wash tank, (ii) a second set of nozzles disposed within the wash tank, and (iii) a controller. The controller is configured to direct the cleaning fluid through the first set of nozzles to provide a flow of the cleaning fluid in a first direction relative to the set of circuit boards. The controller is further configured to direct the cleaning fluid through a second set of nozzles to provide a flow of the cleaning fluid in a second direction relative to the set of circuit boards after providing the flow of the cleaning fluid in the first direction.

15 Claims, 8 Drawing Sheets

SYSTEMS AND METHODS FOR PROCESSING A SET OF CIRCUIT BOARDS

BACKGROUND OF THE INVENTION

A typical circuit board manufacturing process includes a soldering stage and a cleaning stage. One type of circuit board manufacturing process involves soldering surface mount components to the surface of a bare circuit board and then cleaning the circuit board to remove contaminants. In the soldering stage of this process, automated equipment prints solder paste over mounting locations of the circuit board, places the surface mount components over the mounting locations and in contact with the printed solder paste, and applies heat to activate flux and to melt solder within the solder paste. As a result, solder joints form between the components and the surface of the circuit board. This process may be repeated on the opposite surface of the circuit board in order to utilize space on both sides of the circuit board.

In the cleaning stage, cleaning equipment washes and rinses the populated circuit board to remove contaminants (e.g., organic compounds, cleaning residues, etc.). If the contaminants are not removed, the contaminants could create an undesirable electrical leakage path between conductive structures on the circuit board. In particular, over time, the contaminants could absorb moisture from the air and operate as a catalyst that deposits material between neighboring conductive surfaces eventually resulting in an electrical short.

For example, suppose that a recently manufactured circuit board is placed into operation within an electronic system. Further suppose that an organic contaminant exists on the circuit board surface. Over time, this contaminant may produce a wet battery effect between neighboring circuit board conductors (e.g., between surface traces, solder joints, pads, vias, pins, etc.). That is, the contaminant may absorb moisture and the acidity of the contaminant, in combination with the electrical biasing of the circuit board conductors when the circuit board is in operation, may cause residual metallic ions to migrate toward particular conductive surfaces. Eventually, current leakage commences through a formed conductive path between the neighboring circuit board conductors. At that time, the leakage source is essentially the cathode and the end of the path is essentially the anode of a wet battery. If the conductive path carries a relatively small amount of current, the path may cause only minor damage (e.g., an intermittent short resulting in corrupted data, a product functional failure, etc.). However, if the path continues to grow, the path may carry a high amount current which causes a significant amount of damage (e.g., permanent damage to a component, a thermal event, etc.).

There are a variety of conventional approaches to cleaning circuit boards during the cleaning stage of the circuit board manufacturing process. Some conventional approaches involve the application of an aqueous solvent to the circuit board surfaces. The aqueous solvent typically has a surface tension which is lower than water thus enabling the solvent to more easily penetrate into small gaps and tight areas such as narrow regions between component packages and the circuit board surface (e.g., the narrow space between a Ball Grid Array device and the circuit board surface). Furthermore, the solvent typically includes a surfactant that saponifies contaminants residing on the populated circuit board. That is, the solvent acts as a saponifier by breaking down and dissolving contaminants which are common to the circuit board manufacturing process (e.g., organic residues, dirt, dust, grease, metal ions, etc.).

One conventional cleaning approach which uses aqueous solvent (hereinafter referred to as the "in-line spray approach") involves placing circuit boards onto a conveyor assembly which individually conveys the circuit boards horizontally past an upper set of sprayers which sprays the solvent vertically downward onto the top surface of the circuit boards, and a lower set of sprayers which sprays the solvent vertically upward onto the bottom surface of the circuit boards. As the solvent hits the circuit board surfaces and the circuit board components, the solvent tends to puddle and drip. As the solvent falls off of the circuit boards, the solvent carries away contaminants. The conveyor assembly continues to convey the circuit boards individually past other upper and lower sets of sprayers which spray de-ionized water onto the circuit boards to remove any remaining aqueous solvent.

Another conventional cleaning approach which uses aqueous solvent (hereinafter referred to as the "in-line immersion approach") involves spray under immersion. This approach involves placing circuit boards onto a conveyor assembly which individually conveys the circuit boards horizontally through a tray of aqueous solvent, e.g., the circuit boards are immersed in aqueous solvent which is two to four inches deep. While a circuit board is in the tray, sprayers above and below the circuit board spray the aqueous solvent onto the circuit board. The aqueous solvent dissolves and carries away contaminants residing on that circuit board. Then, as in the earlier-described in-line spray approach, the conveyor assembly individually conveys the circuit boards horizontally through a rinsing stage (e.g., through a tray of de-ionized water, or past upper and lower sets of sprayers which spray de-ionized water) to remove any remaining aqueous solvent.

Yet another convention cleaning approach which uses aqueous solvent (hereinafter referred to as the "batch cleaning approach") involves a technician manually placing multiple circuit boards into an empty tub one at a time by hand so that the circuit boards are vertical and parallel to each other. The technician then closes a lid over the tub and activates a pump assembly which fills the tank with the aqueous solvent. When the tank is full and the circuit boards are completely covered with the solvent, a pair of nozzles on one side of the tank directs the solvent past the circuit boards. In particular, the aqueous solvent tends to flow in a single direction through the defined spaces between the parallel circuit boards. As the solvent flows by the circuit boards, the solvent dissolves and carries away contaminants from the circuit board surfaces. The technician then empties the tank of the solvent, and partially opens the lid so that an air duct outside the tub can draw away solvent vapors from the tub periphery. The technician then one by one manually transfers the circuit boards by hand onto a conveyor assembly that transfers the circuit boards individually through a rinsing stage to remove any remaining solvent.

It should be understood that there are a variety of conventional "No Clean" approaches which use "No Clean" fluxes and "No Clean" solder pastes. The suppliers of these "No Clean" fluxes and "No Clean" solder pastes contend that the use of such fluxes and solder pastes by the circuit board manufacturer alleviates the need to clean circuit boards using a cleaning process after the soldering process. Such fluxes and solder pastes are best suited for particular types of soldering metals (i.e., Lead as in Tin/Lead solder alloys) and at particular soldering temperatures.

SUMMARY

Unfortunately, there are deficiencies to the above-described conventional approaches to manufacturing circuit boards. For example, in connection with the above-described "No Clean" approaches, there is no such thing as a perfect flux or a perfect solder paste which leaves absolutely no contamination behind. Rather, even the "No Clean" fluxes and the "No Clean" solder pastes still leave at least a minimal amount of contamination on circuit boards, and such contamination poses a threat to the circuit boards over time (e.g., the wet battery effect). In particular, as pitch/density of contacts on component packages increases and as power consumption by components increases over time, circuitry within such components have been growing increasingly sensitive to circuit board cleanliness, e.g., due to changes in surface insulation resistance (SIR).

Additionally, the "No Clean" fluxes and "No Clean" solder pastes are only suitable for use with certain types of solders and at certain temperatures. Accordingly, if the manufacturer uses multiple soldering processes at different temperatures (e.g., to mount components to both sides of the circuit board using re-flow soldering, to mount multi-chip modules having pre-soldered components, etc.), the temperature restrictions of the "No Clean" fluxes and "No Clean" solder pastes hinder the choices of solders and soldering temperatures available to the circuit board manufacturer. Moreover, with growing environmental safety concerns over the use of Lead (i.e., Tin/Lead solder alloys) as a soldering material (i.e., a common soldering metal used with "No Clean" fluxes and "No Clean" solder pastes), the trend may shift away from the "No Clean" approaches and back toward soldering processes that use non-lead solders in tandem with cleaning processes to remove contaminants after the soldering process. Also, any remaining "No Clean" residues tend to char and/or poorly mix with new fluxes during rework processes if performed on the circuit boards thus possibly causing poorer soldering results and perhaps contamination during the rework process.

Furthermore, even if the use of "No Clean" fluxes and "No Clean" solder pastes is not a significant source of contamination and even if such fluxes and pastes remain popular, it is still good practice to run circuit boards through a cleaning stage to ensure proper quality control. For example, a component manufacturer may employ poor cleaning habits during the component manufacturing process and thus provide dirty components, e.g., components having dirt and grease on the component packages and component contacts. When the circuit board manufacturer mounts these dirty components onto the circuit boards, the contamination from the components now passes onto the circuit boards. Even the use of "No Clean" fluxes and "No Clean" solder pastes will not facilitate removal of the contamination from the dirty components. Accordingly, the use of a cleaning process after the soldering process is, in general, a good decision from a quality control perspective.

Additionally, there are deficiencies in the above-described conventional approaches to cleaning circuit boards. For example, in connection with the above-described in-line spray approach, the circuit boards must pass by the sets of sprayers one by one thus limiting the throughput of this cleaning process (i.e., the circuit boards pass through the cleaning stage in a single file manner). Also, the sprayers tend to direct the aqueous solvent perpendicularly against the circuit boards (i.e., the sprayers direct the solvent vertically and the circuit boards are disposed horizontally) so that the sprayers tend not to spray the solvent directly at the component mounting locations (e.g., at the space between the component packages and the circuit board surfaces). Rather, most of the cleaning tends to result from puddling and running of the solvent into and out of the mounting locations. Moreover, even if the sprayers could spray the solvent at a more effective angle toward a contaminated location, the sprayers would not be able to spray the solvent at the location for very long due to the continuous movement of the circuit boards on the conveyor assembly past the sprayers. In addition, the spraying of the solvent tends to quickly volatize the solvent thus using up the solvent at a very fast rate.

Furthermore, in connection with the above-described conventional in-line immersion approach, the circuit boards must pass through the tray of aqueous solvent one by one thus limiting the throughput of this cleaning approach in a manner similar to that of the above-described in-line spray approach. Additionally, in the conventional in-line immersion approach, the circuit boards travel along the conveyor assembly horizontally thus providing a tendency to trap air underneath components even as the circuit boards enter and exit the tray of solvent. Accordingly, the orientation of the circuit boards tends to inhibit effective cleaning of the spaces between the component packages and the circuit board surfaces. Furthermore, the sprayers which spray over the top of the circuit board tend not to be very effective, but instead, tend to simply lift up the top surface of the aqueous solvent and generate surface layer turbulence. Also, the sprayers of this spray under immersion approach tend to promote vapor evaporation of the aqueous solvent.

Additionally, in connection with the above-described conventional batch cleaning approach in which a pair of nozzles at one end of a tub directs aqueous solvent through spaces between circuit boards disposed in a parallel manner within the tub, the cleaning approach is prone to creating boundary or neutral points within the spaces between the circuit boards. That is, the circuit boards components provide a three-dimensional topology that forms small eddies and countercurrents within the spaces between the circuit boards as the pair of nozzles directs the solvent between the circuit boards. As a result, neutral points in which there is little or no movement of solvent tend to form around components thus substantially hindering the effectiveness of the batch cleaning approach.

Furthermore, the above-described conventional batch cleaning approach is unduly manually intensive. In particular, the technician must individually place the circuit boards into the tub one by one prior to cleaning. The technician must also individually remove the circuit boards from the tub to transfer the circuit boards one by one to a rinsing stage. During these times, there are opportunities for the technician to inadvertently damage the circuit boards (e.g., hitting a circuit board against another circuit board, nozzle or tub side). Moreover, as the technician transfers each circuit board, the technician may drip solvent from that circuit board onto undesired locations thus posing additional concerns, e.g., dripping solvent onto a shop floor thus posing a safety concern. Also, the technician must briefly lift the lid of the tub at the end of the cleaning process to expose the tub cavity to an air duct that draws the solvent vapors from the tub. At that time, the technician is briefly exposed to the solvent vapors which thus poses another safety concern and forces the technician to endure the solvent odors.

The invention is directed to circuit board processing techniques which involve cleaning a set of circuit boards by providing a first flow of cleaning fluid (e.g., aqueous solvent) in a first direction relative to the set of circuit boards and subsequently a second flow of the cleaning fluid in a second direction relative to the set of circuit boards, while the set of circuit boards is immersed in a wash tank containing the cleaning fluid. The multiple flows of cleaning fluid reduce or even eliminate the likelihood of forming neutral points within the tank of cleaning fluid. In particular, if the flow in the first direction results in a neutral point at a particular location, it is extremely unlikely or even impossible for the flow in the second direction (e.g., the direction opposite the first direction) to form a similar neutral point at the same location. The lack of neutral points results in more-effective washing of the circuit boards to dislodge and dissolve contaminants than conventional cleaning approaches, e.g., a conventional batch cleaning approach where a pair of nozzles provides a flow from one side of a tub to the other past circuit boards in a single direction. Furthermore, use of the tank of cleaning fluid generates less volatilization of the cleaning fluid than the conventional in-line spray approach thus conserving more cleaning fluid for subsequent use on another set of circuit boards. Moreover, the techniques of the invention enable cleaning of multiple circuit boards simultaneously thus providing more throughput than conventional in-line approaches in which the circuit boards pass through the cleaning stages in a single file manner.

One embodiment of the invention is directed to a circuit board processing system which includes a wash tank configured to contain cleaning fluid, and a positioning subsystem configured to immerse a set of circuit boards into the wash tank when the wash tank contains the cleaning fluid. The set of circuit boards includes at least two circuit boards. The circuit boards are substantially parallel to each other when immersed into the wash tank. The circuit board processing system further includes a flow control subsystem having (i) a first set of nozzles disposed within the wash tank, (ii) a second set of nozzles disposed within the wash tank, and (iii) a controller. The controller is configured to direct the cleaning fluid through the first set of nozzles to provide a flow of the cleaning fluid in a first direction relative to the set of circuit boards while the set of circuit boards is immersed in the wash tank containing the cleaning fluid. The controller is further configured to direct the cleaning fluid through a second set of nozzles to provide a flow of the cleaning fluid in a second direction relative to the set of circuit boards after providing the flow of the cleaning fluid in the first direction and while the set of circuit boards is immersed in the wash tank containing the cleaning fluid.

The use of each set of nozzles enables sustained flow of the cleaning fluid around the circuit boards into to provide thorough washing of the circuit boards which is superior to that of the conventional in-line spray approach in which sprayers never spray constantly at the same location due to the continuous movement of the circuit boards by the conveyor assembly. Furthermore, the use of different sets of nozzles to provide flows of cleaning fluid in different directions at different times reduces or even prevents the possibility of forming neutral points which is very possible using a conventional batch cleaning approach that provides a flow of aqueous solvent in only a single direction relative to circuit boards. Rather, in the system, if a first set of nozzles does not adequately provide an effective cleaning flow of cleaning fluid, the second set of nozzles will likely provide effective cleaning flow and not create a similarly located neutral point thus avoiding the possibility of incomplete cleaning as in the conventional batch cleaning approach. Additionally, the circuit board processing system is capable of cleaning multiple circuit boards simultaneously thus providing more throughput than conventional in-line approaches (e.g., an in-line immersion approach which cleans circuit boards one at a time).

In some arrangements, the set of circuit boards is disposed within in a rack to form a rack of circuit boards. In these arrangements, the positioning subsystem is configured to lower the rack of circuit boards into a position within the wash tank that is between the first set of nozzles and the second set of nozzles. Such operation enables positioning subsystem to lower the rack of circuit boards into the cleaning fluid while the wash tank remains filled with cleaning fluid thus alleviating the time delays and energy needed to fill and drain the tank when processing each set of circuit boards which are deficiencies of the conventional batch cleaning approach.

In some arrangements, the circuit board processing system further includes a primary rinse tank disposed adjacent to the wash tank, and a secondary rinse tank dispose adjacent to the primary rinse tank. In one arrangement, the secondary rinse tank is configured to contain rinsing fluid (e.g., de-ionized water) which overflows an edge of the secondary rinse tank into the primary rinse tank. In these arrangements, the positioning subsystem is configured to move the rack of circuit boards out of the wash tank and into the primary rinse tank, and subsequently out of the primary rinse tank and into the secondary rinse tank. In some arrangements, the positioning subsystem is further configured to, when lowering the rack of circuit boards into the rinse tank, simultaneously lower another rack of circuit boards into the wash tank to process multiple racks of circuit boards in a pipelined manner. Such operation enables multiple racks of circuit boards to be processed by the system simultaneously for higher throughput. Such operation also enables a single set of equipment (e.g., pumps, a series of gross and fine filters, etc.) to be used by both rinse tanks due to the flow of rinsing fluid from the secondary rinse tank into the primary rinse tank.

In some arrangements, the circuit board processing system further includes a ventilation subsystem coupled to the wash tank, the primary rinse tank and the secondary rinse tank. In one arrangement, the ventilation subsystem includes (i) a single ventilation duct and (ii) a fan assembly which is configured to ventilate vapors emanating from the wash tank, the primary rinse tank, and the secondary rinse tank through the single ventilation duct to simultaneously remove vapors from the wash tank, the primary rinse tank and the secondary rinse tank. Accordingly, the same ventilation components can be used to remove vapors from the cleaning and rinsing portions of the circuit board processing system.

In some arrangements, the circuit board processing system further includes a planar-shaped barrier coupled to the wash tank, the primary rinse tank, and the secondary rinse tank. The planar-shaped barrier is configured to define at least a portion of (i) an enclosed wash tank space above the wash tank, (ii) an enclosed primary rinse tank space above the primary rinse tank, and (iii) an enclosed secondary rinse tank space above the secondary rinse tank. In these arrangements, the ventilation subassembly is configured to simultaneously draw the vapors from the enclosed wash tank space above the wash tank, the enclosed primary rinse tank space above the primary rinse tank, and the secondary rinse tank space above the secondary rinse tank. Such a configuration shields the user of the circuit board processing system from any harmful vapors directly emanating from the cleaning and rinse tanks in a "zero-exposure" manner.

In some arrangements, the circuit board processing system further includes a draining assembly configured to tilt the set of circuit boards from a first angle in which the bottom edge of each circuit board simultaneously resides substantially parallel to a floor surface to a second angle in which the bottom edge of each circuit board simultaneously resides substantially in a range between 30 degrees and 60 degrees relative to the floor surface (e.g., to a 45 degree angle for at least one second). Such operation removes excess fluid from the circuit boards thus reducing the amount of time and energy required to dry the circuit boards in a subsequent drying stage.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to circuit board processing techniques which involve cleaning circuit boards by providing a first flow of cleaning fluid (e.g., aqueous solvent) in a first direction relative to the circuit boards and subsequently a second flow of the cleaning fluid in a second direction relative to the circuit boards, while the circuit boards are immersed in a wash tank containing the cleaning fluid. The multiple flows of cleaning fluid at different times reduce or even eliminate the likelihood of forming neutral points within the tank of cleaning fluid. In particular, if the flow in the first direction results in a neutral point at a particular circuit board location, the chance is extremely remote that the flow in the second direction (e.g., a direction opposite the first direction) will form a similar neutral point at the same location. Rather, the turbulence caused by the different flows, as well as the changing of the flows in different directions, results in more-effective circuit board cleaning than conventional cleaning approaches, e.g., a conventional batch cleaning approach where a pair of nozzles provides a flow from one side of a tub to the other side of the tub past circuit boards in a single direction. Furthermore, use of the tank of cleaning fluid provides less volatilization of the cleaning fluid than a conventional in-line spray approach thus conserving the cleaning fluid for subsequent use on other circuit boards. Moreover, the techniques of the invention enable cleaning of multiple circuit boards simultaneously thus providing more throughput than conventional in-line approaches which clean circuit boards one at a time.

Figure 1:
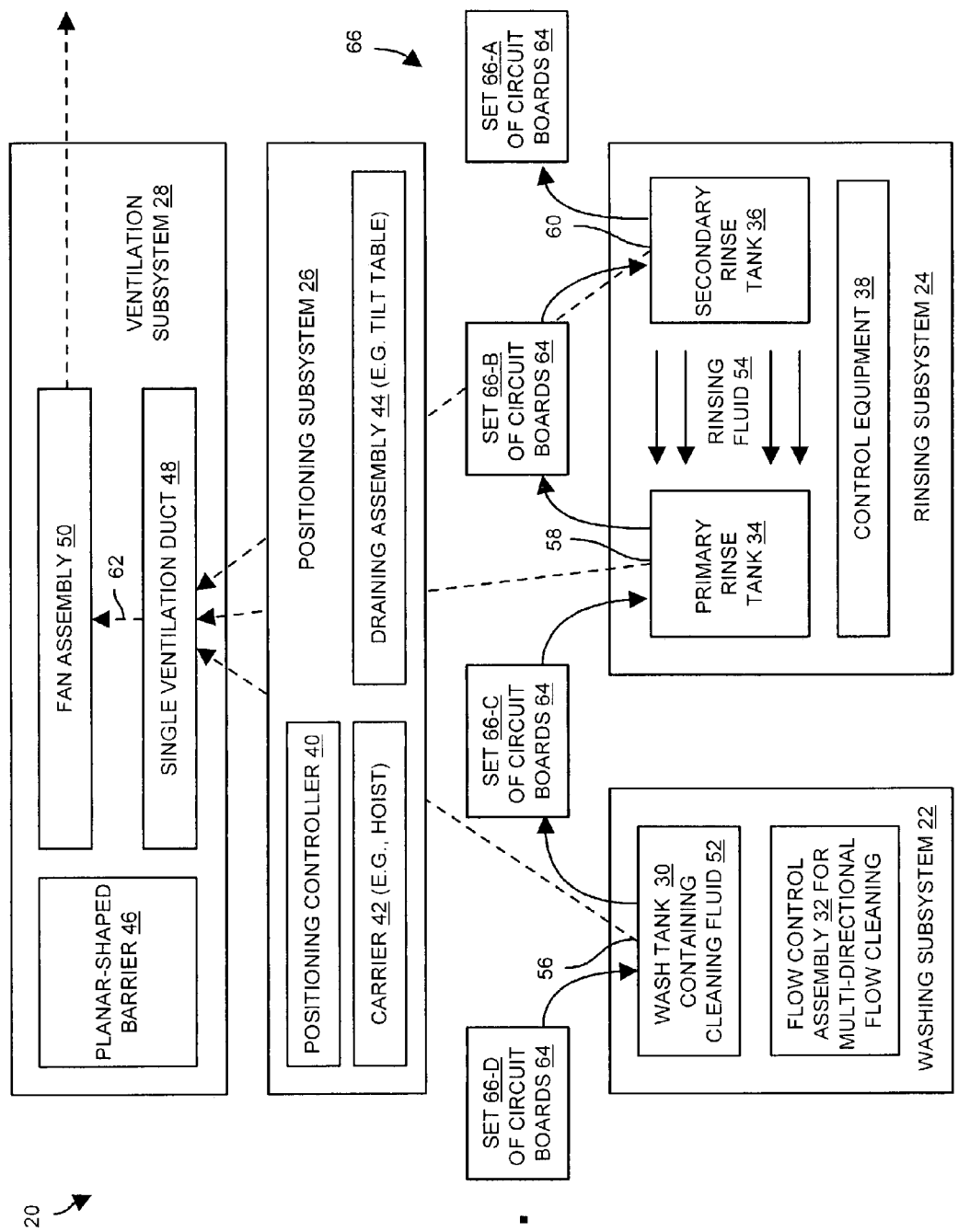
FIG. 1 shows a block diagram of a circuit board processing system which is suitable for use by the invention.

FIG. 1 shows a circuit board processing system 20 which is suitable for use by the invention. The circuit board processing system 20 includes a washing subsystem 22, a rinsing subsystem 24, a positioning subsystem 26 and a ventilation subsystem 28. The washing subsystem 22 includes a wash tank 30 and a flow control assembly 32. The rinsing subsystem 24 includes a primary rinse tank 34, a secondary rinse tank 36 and control equipment 38. The positioning subsystem 26 includes a positioning controller 40, a carrier 42 and a draining assembly 44 which is equipped with a tilt mechanism. The ventilation subsystem 28 includes a planar-shaped barrier 46, a single ventilation duct 48, and a fan assembly 50.

The wash tank 30 of the washing subsystem 22 is configured to contain cleaning fluid 52 (e.g., aqueous solvent). During normal operation, the wash tank 30 maintains a reservoir of cleaning fluid 52, and a flow control assembly 32 provides a flow of the cleaning fluid 52 in different directions at different times. Furthermore, the flow control assembly 32 of the washing subsystem 22 is configured to robustly maintain and manage the amount of cleaning fluid 52 within the wash tank 30. In particular, the flow control assembly 32 includes a cleaning fluid source or secondary cleaning fluid reservoir (e.g., an input pump for inputting concentrated solvent, a de-ionized water source, a mixing tank, a series of filters, etc.) that replenishes volatized cleaning fluid 52 and when the level of cleaning fluid 52 within the wash tank 30 drops below an adequate level for proper operation of the circuit board processing system 20. The operation of the cleaning fluid source enables the system 20 to automatically mix more cleaning fluid 52 and maintain the wash tank 30 at a full level with little or no user intervention (e.g., the user does not need to stop the system 20 and make more cleaning fluid 52 each time the level of cleaning fluid 52 drops below the specified level).

In one arrangement, the washing subsystem 22 employs a gross filter assembly and a fine filter assembly which are disposed in series with a pump assembly to filter out solid material that would otherwise impinge the circuit board. In particular, the gross filter assembly filters out relatively large solid material (e.g., Fiberglass fines, solder balls, solder mask material, glass fibers, etc.). The fine filter assembly filters out similar material but on a smaller particle scale (e.g., 10 micron filtration).

Similarly, the rinse tanks 34, 36 of the rinsing subsystem 24 are configured to contain rinsing fluid 54 (e.g., de-ionized water). The control equipment 38 of the rinsing subsystem 24 is configured to robustly maintain and manage the rinsing fluid 54 within the rinse tanks 34, 36 during operation of the circuit board processing system 20. In one arrangement, the height of the rinsing fluid 54 is lower in the primary rinse tank 34 than in the secondary rinse tank 36, and the rinsing fluid 54 overflows an edge of the secondary rinse tank 36 into the primary rinse tank 34. This arrangement allows the control equipment 38 to include a single set of fluid control devices (e.g., pumps, filters, a de-ionized water source, etc.) for processing the rinsing fluid 54 of both tanks 34, 36.

In connection with the ventilation system 28, the planar-shaped barrier 46 is configured to protect a user of the circuit board processing system 20 from direct vapor exposure at spaces immediately over the tanks 30, 34, and 36. In particular, the planar-shaped barrier 46 provides a wall between a space 56 over the wash tank 30, a space 58 over the primary rinse tank 34 and a space 60 over the secondary rinsing space 36. Accordingly, the planar-shaped barrier 46 shields the user from vapors emanating from the tanks 30, 34, and 36 during operation of the circuit board processing system 20. Furthermore, the fan assembly 50 draws vapors 62 from these spaces 56, 58 and 60 through the single ventilation duct 48 in order to remove these vapors from the system 20 (see the dashed lines 60 in FIG. 1), and the user is not exposed to any of the vapors directly. The configuration of the single ventilation duct 48 and the fan assembly 50 enables the ventilation subsystem 28 to utilize a single set of devices to convey these potentially noxious vapors 62 out of the system 20 and away from the user. In one arrangement, the planar-shaped barrier 46 is easily removable from its normal operating position and installable back to its normal operating position in order to facilitate access to particular areas of the system 20 (e.g., in order for a user to periodically service certain internal parts of the system 20, etc.).

The positioning subsystem 26 is configured to move circuit boards 64 through the system 20 in sets 66. Each set 66 of circuit boards 64 is capable of including multiple circuit boards 64 (e.g., eight, ten, twelve, etc.) for greater throughput than conventional in-line approaches that process circuit boards one at a time. In particular, the carrier 42 of the positioning subsystem 26 is configured to transport a set 66 of circuit boards 64 into the wash tank 30 for a cleaning operation (e.g., for removal of acidic flux residues, dirt and grease from components, etc.), then from the wash tank 30 into the primary rinse tank 34 for a gross rinsing operation, then from the primary rinse tank 34 into the secondary rinse tank 36 for an enhanced rinsing operation, and then out of the secondary rinse tank 36. The carrier 42 is configured to perform these transfers while the tanks 30, 34, 36 remain filled with fluid. Accordingly, time and energy is not wasted filling up the tanks 30, 34, 36 with fluid prior to each operation and emptying the tanks 30, 34, 36 of fluid after each operation. Furthermore, since the tanks 30, 34, 36 are left filled and the fluid turbulence remains minimal at the fluid surface vis-à-vis a conventional in-line spray approach, the fluids 52, 54 tend to volatize less quickly. Accordingly, the system 20 tends to conserve fluid vis-à-vis a conventional in-line spray approach which tends to quickly volatize fluid. Moreover, the de-ionized water, which is generally expensive, tends to maintain its properties longer since it is not mixed with air as thoroughly as in the convention in-line spray approach.

In some arrangements, the positioning subsystem 26 is configured to transfer sets 66 of circuit boards 64 simultaneously through the system 20. In particular, the carrier 42 of the positioning system 26 concurrently moves the sets 66 through the system 20 in locked-step. For example, in some arrangements, the carrier 42 utilizes an assembly of hoists which is capable of moving in the vertical direction to synchronously deposit different sets 66 of circuit boards 64 into the various tanks 30, 34, 36 or to synchronously extract the different sets 66 of circuit boards 64 from the tanks 30, 34, 36. In these arrangements, the assembly of hoists of the carrier 42 is further capable of moving in the horizontal direction to synchronously convey each set 66 of circuit boards 64 from one location (e.g., a position over one tank) to another location (e.g., a position over another tank) in lock step. Accordingly, the system 20 is capable of processing multiple sets 66 of circuit boards 64 simultaneously in a pipelined manner for very high throughput (e.g., see circuit board sets 66-A, 66-B, 66-C, 66-D in FIG. 1).

It should be understood that, since the sets 66 of circuit boards 64 enter the primary rinse tank 34 after exiting the wash tank 30 and then enter the secondary rinse tank 36 after exiting the primary rinse tank 34, the rinsing fluid 54 within the secondary rinse tank 36 is cleaner than the rinsing fluid 54 within the primary rinse tank 34. That is, the majority of contaminants and solvent tends to collect within the primary rinse tank 34, and only residual contaminants and solvent not removed within the primary rinse tank 34 is left for removal in the secondary rinse tank 36. Accordingly, the transfer of rinsing fluid 54 from the secondary rinse tank 36 into the primary rinse tank 34 (i.e., the overflow of rinsing fluid 54 from the secondary rinse tank 36 into the primary rinse tank 34) is not detrimental to the operation of the rinsing subsystem 24. Rather, such operation enables the control equipment 38 of the rinsing subsystem 24 to employ a single set of devices (e.g., pumps, filters, rinsing fluid source, etc.) within the rinsing subsystem 24 even though the rinsing subsystem 24 utilizes multiple rinse tanks 34, 36 for more thorough cleansing of the circuit boards 64.

The draining assembly 44 of the positioning subsystem 26 removes excess fluid from the circuit boards 64. In some arrangements, the draining assembly 44 tilts the sets 66 of circuit boards 64 after they exit the secondary rinse tank 36 thus enabling any residual rinsing fluid 54 to drain off and any subsequent drying operation performed on the sets 66 of circuit boards 64 to be more effective and use less energy. In other arrangements, the draining assembly 44 tilts the sets 66 of circuit boards 64 after the sets 66 exit each tank 30, 34, 36 to minimize contamination of the fluids from tank to tank (e.g., the draining assembly 42 works in combination with the carrier 42 to tilt the sets 66 of circuit boards 64 after they exit each tank 30, 34, 36). Further details of the draining assembly 44 as well as of the cleaning and rinsing subsystems 22, 24 will be provided after the following explanation of further details of a suitable transport mechanism for the circuit boards 64.

Figure 2:
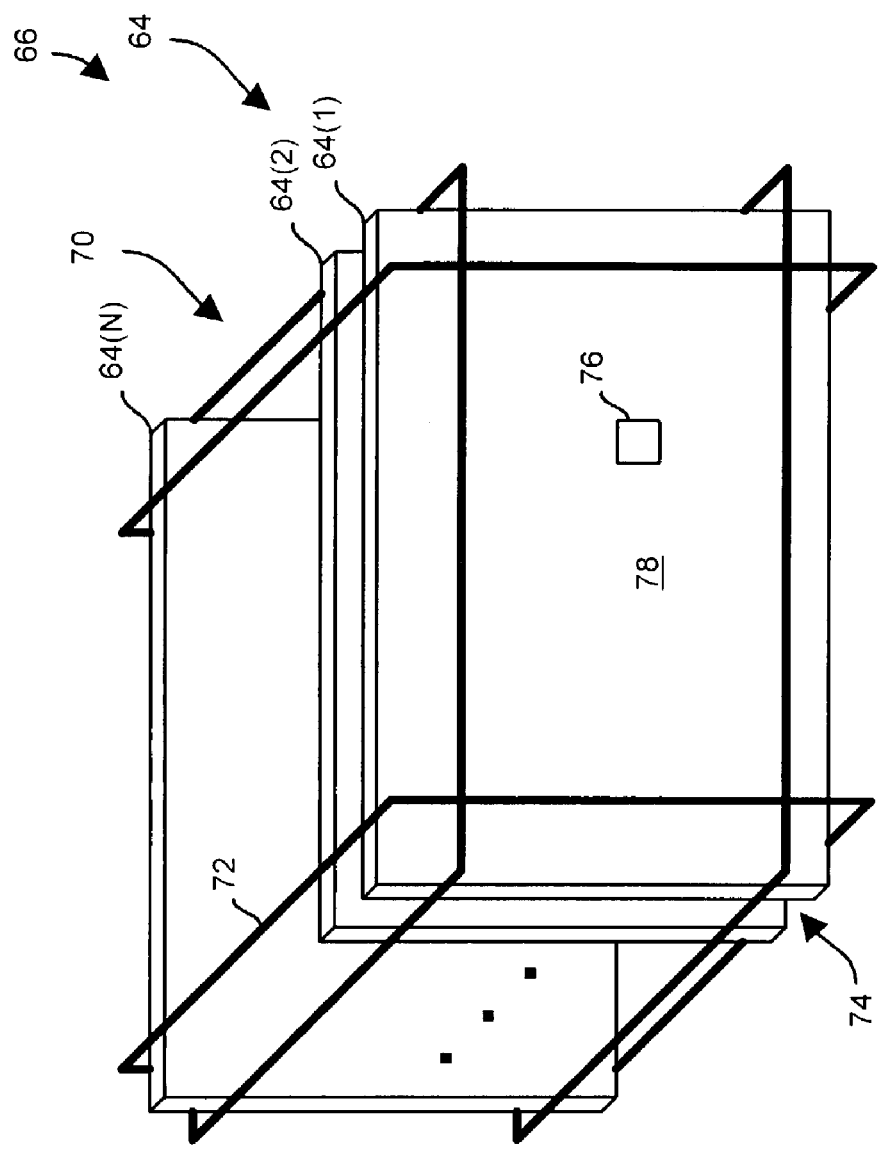
FIG. 2 shows a rack of circuit boards which is suitable for processing by the circuit board processing system of FIG. 1.
Figure 2:
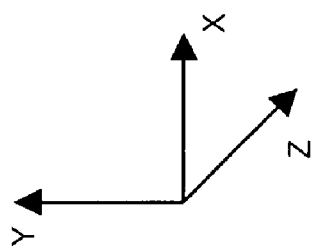

FIG. 2 shows a set 66 of circuit boards 64 which is suitable for use by the circuit board processing system 20 of FIG. 1. As shown in FIG. 2, a rack 70 holds the set 66 of circuit boards 64 in substantially fixed positions relative to each other. In particular, the rack 70 includes frame members 72 that support the circuit boards 64 but that minimize interference of fluid flow around the circuit boards 64. In one arrangement, the frame members 72 include rigid bars (e.g., metal, plastic, etc.) that extend around the circuit boards 64 and that hold the circuit boards 64 in place (e.g., bars extending in the horizontal, vertical and/or diagonal directions).

Preferably, the rack 70 holds multiple circuit boards 64(1), . . . 64(N) (i.e., at least two) and orients the circuit boards 64(1), . . . 64(N) (collectively, circuit boards 64) so that they are substantially parallel to each other. The circuit boards 64 extend in a planar manner along the X-Y plane and vertically relative to a floor surface (i.e., the X-Z plane). Additionally, the circuit boards 64 stack in the Z-direction in a magazine-like manner thus defining a set of parallel open spaces or channels 74 between the circuit boards 64.

It should be understood that each circuit board 64 includes a set of circuit board components 76 mounted to the surface 78 of that circuit board 64 (only one component 76 is shown on the outermost circuit board 62 of FIG. 2 for simplicity). Such components 76 may include but are not limited to surface mount technology (SMT) devices (e.g., Ball Grid Array Devices, capacitors, resistors, diodes, etc.), pre-fabricated multi-chip modules (MCMs), lead frame devices, connectors, LEDs, independent electronic components and pins, and the like.

It should be further understood that the frame members 72 provide attachment regions that are particularly well-suited for grasping by the carrier 42 (e.g., a hoist assembly) of the positioning subsystem 26. In one arrangement, these regions of the frame members 72 provide outwardly-bending details (i.e., loop-shaped or inverted U-shaped extensions) at the top of the rack 70 to enable arm-like hooks of the carrier 42 to latch onto the rack 70 (in order to pick up the rack 70) and to unlatch from the rack 70 (in order to let go of the rack 70) without interference from the circuit boards 64.

The frame members 72 also support the circuit boards 64 above a horizontal surface thus preventing the edges of the circuit boards 64 from inadvertently scuffing on surfaces in a manner that could damage or contaminate the circuit boards 64. As a result, the rack 70 is well-suited for sliding or gliding from one surface to another. In particular, the rack 70 of circuit boards 64 is well-suited for transferring from a portable support table or cart (e.g., a wheeled carrier that is capable of rolling over a floor surface) to a platform underneath a pick-up or input location for the carrier 42 of the system 20, and from an output location of the system 20 back onto the portable cart. Accordingly, the user does not need to exert significant effort in transporting the racks 70 of the circuit boards 64 to and from the circuit board processing system 20.

In one arrangement, the racks 70 of circuit boards 64 reside in the orientation shown in FIG. 2 when residing in the tanks 30, 34, 36 (also see FIG. 1). As such, the circuit boards 64 extend vertically thus facilitating percolation of air out of tight spaces between the component packages and the circuit board surface when the circuit boards 64 are immersed into the tanks 30, 34, 36. Such orientations enables the fluids 52, 54 to more easily displace the air in such spaces and thus thoroughly reach mounting locations which tend to hide contaminants. Similarly, such orientations facilitate draining of the circuit boards 64 when the circuit boards are removed from the tanks 30, 34, 36. Accordingly, there are superior fluid flow and fluid draining behavior associated with using of the rack 70 of vertically oriented circuit boards 64 vis-à-vis conventional in-line approaches that orient circuit boards horizontally thus somewhat inhibiting air percolation and fluid drainage. Further details of the invention will now be provided with reference to FIGS. 3 and 4.

Figure 3:
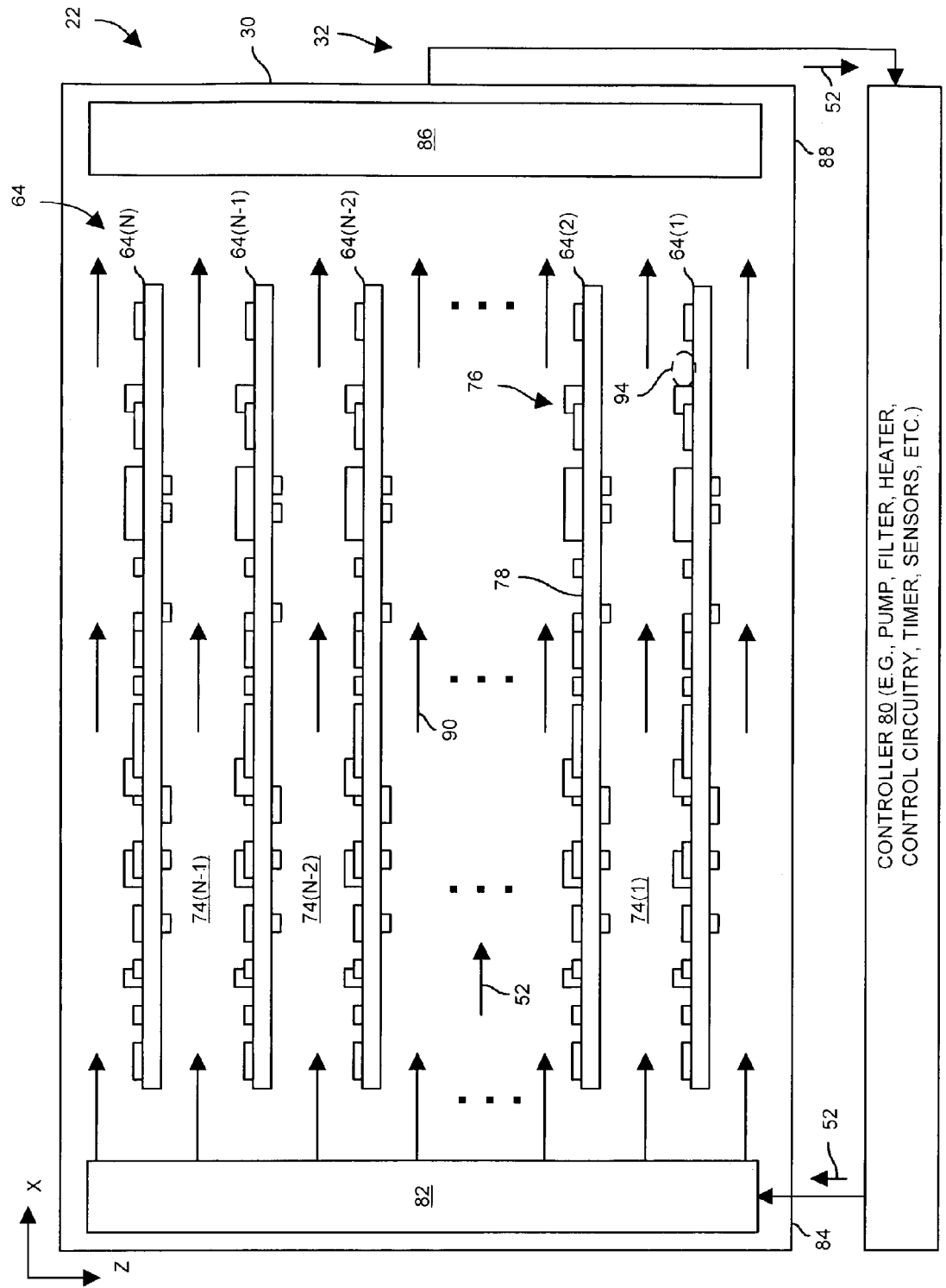
FIG. 3 shows a washing subsystem of the circuit board processing system of FIG. 1 when providing a flow of cleaning fluid in a first direction.
Figure 4:
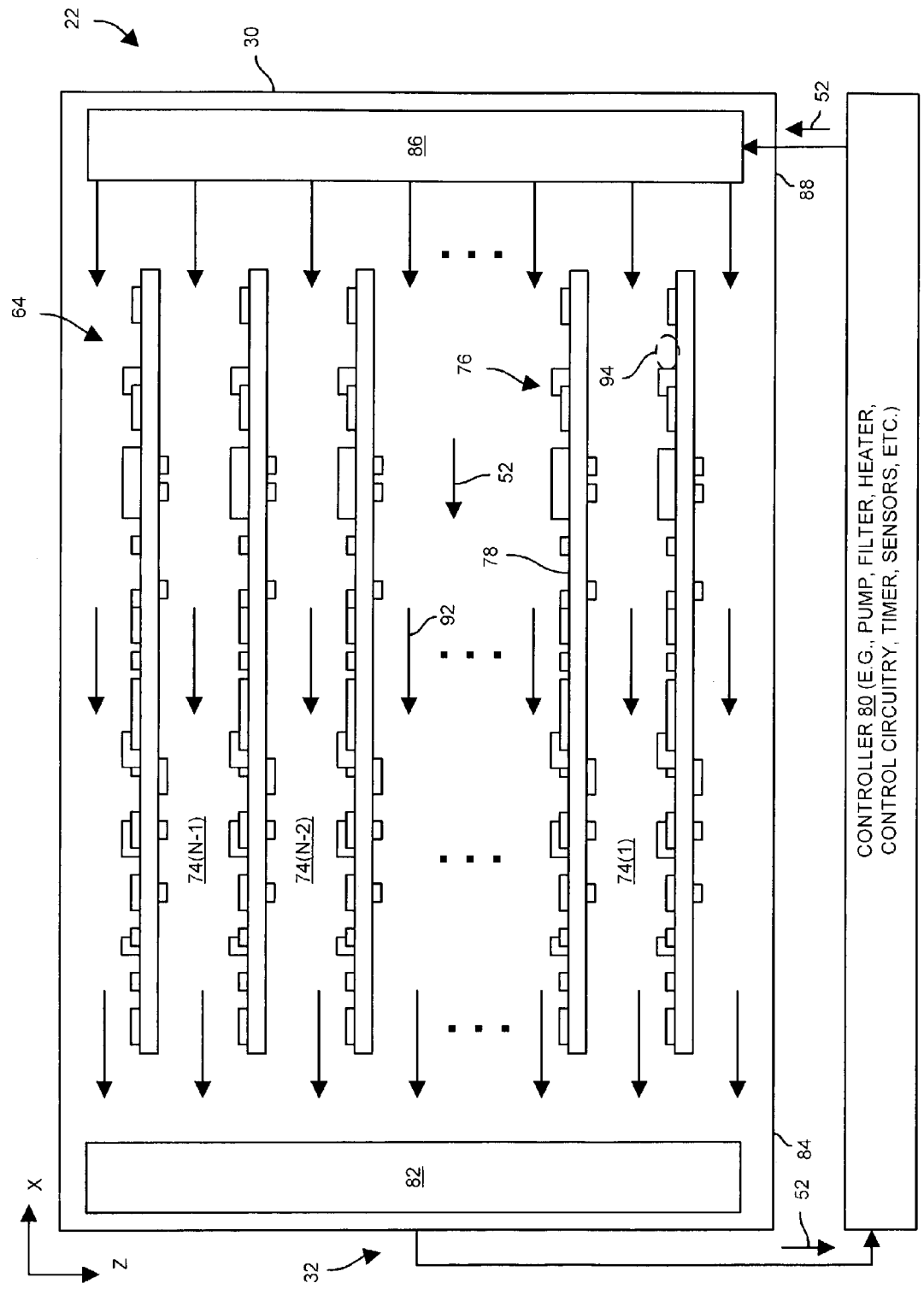
FIG. 4 shows the washing subsystem of FIG. 3 when providing a flow of cleaning fluid in a second direction which is opposite the first direction.

FIGS. 3 and 4 show block diagrams of the washing subsystem 22. As mentioned earlier in connection with FIG. 1, the cleaning system 22 includes a wash tank 30 which is filled with cleaning fluid 52 during normal operation, and a flow control assembly 32 which is capable of providing multi-directional flow of the cleaning fluid 52 at different times. The flow control assembly 32 includes a controller 80 (i.e., an assemblage of electronics, pumps, heaters, filters, etc.), a first set of nozzles 82 disposed on first side 84 of the wash tank 30, and a second set of nozzles 86 disposed on second side 88 of the wash tank 30 which is opposite the first side 84.

In one arrangement, the first set of nozzles 82 includes multiple rigid tubes (e.g., four tubes) which extend across the first side 84. Each tube of the first set of nozzles 82 defines a set of apertures which aims at the second side 88 in a direction 90 (see FIG. 3). Similarly, the second set of nozzles 86 includes multiple rigid tubes (e.g., four tubes) which extend across the second side 88. Each tube of the second set of nozzles 86 defines a set of apertures which aims at the first side 84 in a direction 92 (see FIG. 4).

For illustration purposes only, FIGS. 3 and 4 provide top views of the wash tank 30 showing the relative positions of the sets of nozzles 82, 86. By way of example only, FIGS. 3 and 4 further show the wash tank 30 after the positioning subsystem 26 has deposited a set 66 of circuit boards 64 into the wash tank 30. Although the rack 70 is omitted for simplicity (e.g., to better illustrate the sparging directions of the nozzles 82, 86), it should be understood that the circuit boards 64 are held substantially parallel to each other and in their vertical orientations by the rack 70 at all times while the circuit boards 64 reside in the wash tank 30. It should be further understood that the positioning subsystem 26 is capable of lowering the rack 70 of circuit boards 64 into the wash tank 30 and raising the rack 70 of circuit boards 64 from the wash tank 30 in an automated manner (e.g., using computer controlled robotics) to minimize the amount of manual effort by the user (e.g., the user does not need to put a hand into the fluid to remove the circuit boards 64). In particular, the user may simply locate the rack 70 of circuit boards 64 at a particular input location of the circuit board processing system 20 and push a button to activate control circuitry of the system 20.

In particular, in response to the button press, the various electronics within the various subsystems 22, 24, 26 of the circuit board processing system 20 come into action. That is, in particular control circuitry within the system 20 begins operation. Although the majority of this control circuitry may be physically located in single location within the system 20 (e.g., a general purpose computer or computerized programmable device disposed within a protected panel or control box having a lock for security), this circuitry has been described above as being logically distributed among the various subsystems 22, 24, 26 of the system 20. In particular, this control circuitry includes, among other things, electronic circuitry within the flow control assembly 32 of the washing subsystem 22, electronic circuitry within the control equipment 38 of the rinsing subsystem 24, and electronic circuitry within the positioning controller 42 of the positioning subsystem 26 (also see FIG. 1). The operation of these circuits will now be explained in further detail.

With reference to the solid arrows in FIG. 1, in response to the button press from the user, the positioning controller 40 of the positioning subsystem 26 operates the carrier 42 to transport the rack 70 of circuit boards 64 from the input location to the wash tank 30. To this end, the positioning controller 40 operates the carrier 42 (e.g., a hoist assembly) which vertically lowers over the rack 70 of circuit boards 64 and grabs the rack 70, vertically raises the rack 70, shifts horizontally over the wash tank 30, and vertically lowers the rack 70 into the wash tank 30 and releases the rack 70 while the wash tank 30 remains filled with the cleaning fluid 52, and then vertically moves clear of the wash tank 30 (e.g., vertically moves out of the way). In one arrangement, the positioning controller 40 further controls the opening and closing of a set of sliding doors and lids which, in combination with the planar-shaped barrier 46, operates to protect the user against direct exposure to the cleaning fluid 52 (e.g., aqueous solvent) and to minimize the escape of cleaning fluid fumes in the direction of the user (see the dashed lines 62 in FIG. 1 which represent vapors from the tanks 30, 34, 36).

After the positioning controller 40 positions the rack 70 of circuit boards 64 within the wash tank 30 between the sets of nozzles 82, 86, the controller 80 of the washing subsystem 22 operates to generate a flow of cleaning fluid 52 within the wash tank 30 to wash the circuit boards 64 in response to a notification from the positioning controller 40 (e.g., a signal). In particular, the controller 80 of the washing subsystem 22 (see FIG. 3) operates a set of valves and pumps to direct cleaning fluid 52 past the circuit boards 64 to clean wash the circuit boards 64. In particular, the set of valves and pumps draws the cleaning fluid 52 from a location at the bottom of the wash tank 30 past a set of heaters that heats the cleaning fluid 52 to an optimal operating temperature and through a set of filters that filters out contaminants within the cleaning fluid 52. The set of valves and pumps then forces the cleaning fluid 52 under pressure through the first set of nozzles 82 so that pressurized cleaning fluid 52 flows from the first set of nozzles 82 at the circuit boards 64, but not from the second set of nozzles 86 (e.g., some valves open to allow cleaning fluid 52 to flow from the pumps to the first set of nozzles while other valves close to prevent flow of the cleaning fluid 52 from the pumps to the second set of nozzles 86). The particular velocity of the cleaning fluid 52 within the wash tank 30 can be increased for more thorough cleaning (e.g., for more sparging action) by increasing the number nozzles, the capacity or number of pumps, etc.

The cleaning fluid 52 exits the first set of nozzles 82 and travels in the first direction 90 (see FIG. 3) through the channels 74 between the circuit boards 64 from first side 84 of the wash tank 30 to the second side 88. As the cleaning fluid 52 passes by the components 76 and the circuit board surfaces 78, the cleaning fluid 52 operates as a saponifier by breaking down and dissolving contaminants that reside thereon. Additionally, a surfactant within the cleaning fluid 52 which lowers the surface tension of the cleaning fluid 52, in combination with the vertical orientation of the circuit boards 64 that facilitates fluid penetration and bubbling away of air trapped between components 76 and the circuit board surfaces 78, operate to reach difficult tight and narrow spaces for optimal distribution of the cleaning fluid 52 around and by the circuit board geometries.

The controller 80 is configurable so that the user can change the amount of time that the controller 80 directs the cleaning fluid 52 through the wash tank in the first direction 90 (see FIG. 3), e.g., the user can modify a default or predetermined time setting. This amount of time can be based on a variety of factors known to the user such as the geometry and size of the circuit boards 64, past history of cleanliness of the supplied components 76 on the circuit boards 64, statistical results of circuit board previously processed by the circuit board processing system 20, etc. In one arrangement, the amount of time is on the order of several minutes (e.g., eight minutes, nine minutes, ten minutes, etc.), but can be increased or decreased from this default starting point.

After the controller 80 operates to provide the cleaning fluid 52 through the wash tank 30 in the first direction 90 for the specified period of time, the controller 80 shifts the operation of the set of valves and pumps so that the cleaning fluid 52 flows in the second direction 92 from the second side 88 of the wash tank 30 to the first side 84 (see FIG. 4). In one arrangement, the controller 80 directs the pumps to continue to operate in the same direction but directs the valves close off the flow of cleaning fluid 52 to the first set of nozzles 82 and open the flow of cleaning fluid 52 to the second set of nozzles 86.

It should be understood that it is possible that the flow of cleaning fluid 52 in the first direction 90 relative to the circuit boards 64 may result in small micro-currents that ebb and flow in directions other than the direction 90. Occasionally, due to the particular geometries of certain circuit boards (e.g., the layout of components 76 on the circuit board surfaces 78), the micro-currents may offset resulting in an area 94 (FIG. 3) of substantially non-flowing cleaning fluid 52, i.e., a neutral point. For example, counter-currents in the direction 92 may offset the flow of cleaning fluid 52 in the direction 90 resulting in somewhat stagnant cleaning fluid 52 in the area 94 adjacent one or more circuit boards 64 (see the dashed area 94 of FIG. 3). In such an area 94, there is little or no physical movement of cleaning fluid 52. Nevertheless, the mere existence of the cleaning fluid 52 within the area 94 while the circuit boards 64 are immersed within the wash tank 30 provides an opportunity for contaminant removal (e.g., dissolving and carrying away of dirt, grease, etc.).

Moreover, it should be further understood that such areas 94 of stagnant fluid typically are non-permanent and may last for only a short period of time. Thus, if the controller 80 is configured to run in the first direction 90 for a significant duration (e.g., several minutes), it is easily possible that a neutral point in the area 94 will come and go, and that the cleaning action of the cleaning fluid 52 passing through the area 94 while the neutral point does not exist will provide robust and reliable cleaning of the adjacent portions of the circuit boards 64.

Furthermore, when the flow of cleaning fluid 52 changes toward the second direction 92, the turbulence of the cleaning fluid 52 around the circuit boards 64 greatly enhances the cleaning action of the cleaning fluid 52. Moreover, once the flow settles in the second direction 92 it is extremely unlikely that a neutral point will form in the same area 94 as before when the flow of cleaning fluid 52 was in the first direction 90. It should be understood that the persistent sparging effect from the nozzles 82, 86 provides enhanced mechanical impingement and stripping forces for dislodging material from the circuit boards 64 that is superior to the simple puddling and running action of aqueous solvent which characterizes the conventional in-line spray approach. Plus, as mentioned earlier, a multi-staged gross and fine filtration assembly in series with the pumps provides thorough removal of the contaminants from the wash tank 30. Thus, the operation of the circuit board processing system 20 provides superior cleaning than conventional in-line approaches which do not maintain a flow of fluid over any particular location of a circuit board for an extended amount of time due to the continuous movement of the conveyor, and also provides superior cleaning to conventional batch cleaners which only direct fluid in a single direction relative to a batch of circuit boards and which thus are most susceptible to neutral points.

It should be further understood that the operation and particular cycling of the washing subsystem 22 is configurable. For example, the electronics of the system 20 enable the user to configure the washing subsystem 22 to repeat the cycle of providing flow in the first direction 90 for a period of time, and subsequently in the second direction 92. To this end, the user is capable of directing the controller 80 as to the number of times the washing subsystem 22 provides the flows in each direction 90, 92 and as to the duration of each flow.

After the controller 80 has completed its programmed washing cycles, the controller 80 turns the pumps off and allows the positioning subsystem 26 to reactivate and remove the rack 70 of circuit boards 64 from the wash tank 30 (also see FIG. 2). In particular, positioning controller 40 receives notification (e.g., an electrical signal) from the controller 80 of the washing subsystem 22 that the cleaning cycle is complete, and then operates to move the rack 70 of circuit boards 64 from the wash tank to the primary rinse tank 34 of the rinsing subsystem 24 (also see FIG. 1). In particular, the positioning controller 40 actuates the set of doors and lids covering the wash tank 30 and vertically lowers the carrier 42 over the rack 70 of circuit boards 64. The carrier 42, under direction of the positioning controller 40, then grabs the rack 70, vertically raises the rack 70 out of the wash tank 30 while the cleaning fluid remains in the wash tank 30, horizontally moves the rack 70 over the primary rinse tank 34, and lowers the rack 70 into the primary rinse tank 34 while the primary rinse tank 34 is filled with rinsing fluid 54 to perform a gross rinse operation on the circuit boards 64. The positioning controller 40 then moves the carrier 42 out of the way of the primary rinse tank 34 and actuates a set of doors and lids to cover the primary rinse tank 34.

At this point, the control equipment 38 of the rinsing subsystem 24 operates to generate a flow of rinsing fluid 54 (e.g., de-ionized water from a de-ionized water source) within the primary rinse tank 34 in response to a notification (e.g., a signal) from the positioning controller 40. In particular, the control equipment 38 includes a set of nozzles, pumps, filters (e.g., gross and fine filters in series), and circuitry similar to that of the washing subsystem 22 to generate flow of rinsing fluid 54. However, it should be understood that the arrangement of such components does not need to be identical to that of the washing subsystem 22. For example, the rinsing subsystem 24 does not need to employ as many nozzles or pumps as the washing subsystem 24 in order to provide adequate rinsing. Rather, a smaller number of nozzles can exist in each rinse tank 34, 36 (e.g., two nozzles on each side of each tank 34, 36), and thus a smaller number of pumps are needed to drive the rinsing fluid 54 through the filters and nozzles. Nevertheless, the movement of the rinsing fluid 54 through the channels 74 of the rack 70 of circuit boards 64 (e.g., see FIG. 2) results in fluid flow which carries away residual cleaning fluid 54, remaining contaminants, etc.

After a predetermined period of time has elapsed, the control equipment 38 sends a notification (e.g., a signal) to the positioning controller 40 that the rinsing cycle within the primary rinse tank 34 is complete (FIG. 1). The positioning controller 40 responds by operating the carrier 42 to transfer the rack 70 of circuit boards 64 from the primary rinse tank 34 to the secondary rinse tank 36 to perform an enhanced rinse operation on the circuit boards 64. The particular details of such a transfer are similar to those provided above when moving the rack 70 from the wash tank 30 to the primary rinse tank 34.

Once the rack 70 is in place within the secondary rinse tank 36 and the carrier 42 is out of the way, the control equipment 38 of the rinsing subsystem 24 operate to generate a fluid of rinsing fluid 54 within the secondary rinse tank 36 in the same manner as that for the primary rinse tank 34. As a result, the circuit boards 64 are exposed to another thorough rinsing cycle. As mentioned earlier, in some arrangements, rinsing fluid 54 enters the secondary rinse tank 36 from a rinsing fluid source and overflows a common edge between the primary rinse tank 34 and the secondary rinse tank 36 into the primary rinse tank 34. This arrangement enables the rinsing subsystem 24 to leverage off a single set of equipment (i.e., rinsing fluid source, pumps, heaters, control circuitry, etc.) for managing the rinsing fluid 54 within both rinse tanks 34, 36 and provides a cost savings (e.g., a savings in component costs, manufacturing cost, maintenance costs, etc.). Accordingly, the rinsing fluid 54 within the secondary rinse tank 36 is less contaminated, i.e., cleaner. As a result, there is improvement made by placing the rack 70 of circuit boards 64 in the secondary rinse tank 36 and flowing the cleaner rinsing fluid 54 through the channels 74 defined by the parallel oriented circuit boards 64.

When the rinsing cycle in the secondary rinse tank 36 is complete, the control equipment 38 notifies the positioning controller 40 of the positioning subsystem 26. The positioning controller 40 responds by operating the carrier 42 to lift the rack 70 of circuit boards 64 out of the secondary rinse tank 36 in a manner similar to that provided above for removing the rack 70 from the wash tank 30 after the cleaning cycle. At this time, rack 70 of circuit boards 64 is now out of the secondary rinse tank 36 with the positioning subsystem 26 maintaining the rack 70 of circuit boards 64 in the orientation shown in FIG. 2 (i.e., with the circuit boards 64 in a substantially vertical orientation to facilitate drainage of rinsing fluid 54 from the circuit boards 64). Nevertheless, a significant amount of rinsing fluid 54 still remains attached to the circuit boards 64. Further details of the invention will now be provided with reference to FIGS. 5 and 6.

Figure 5:
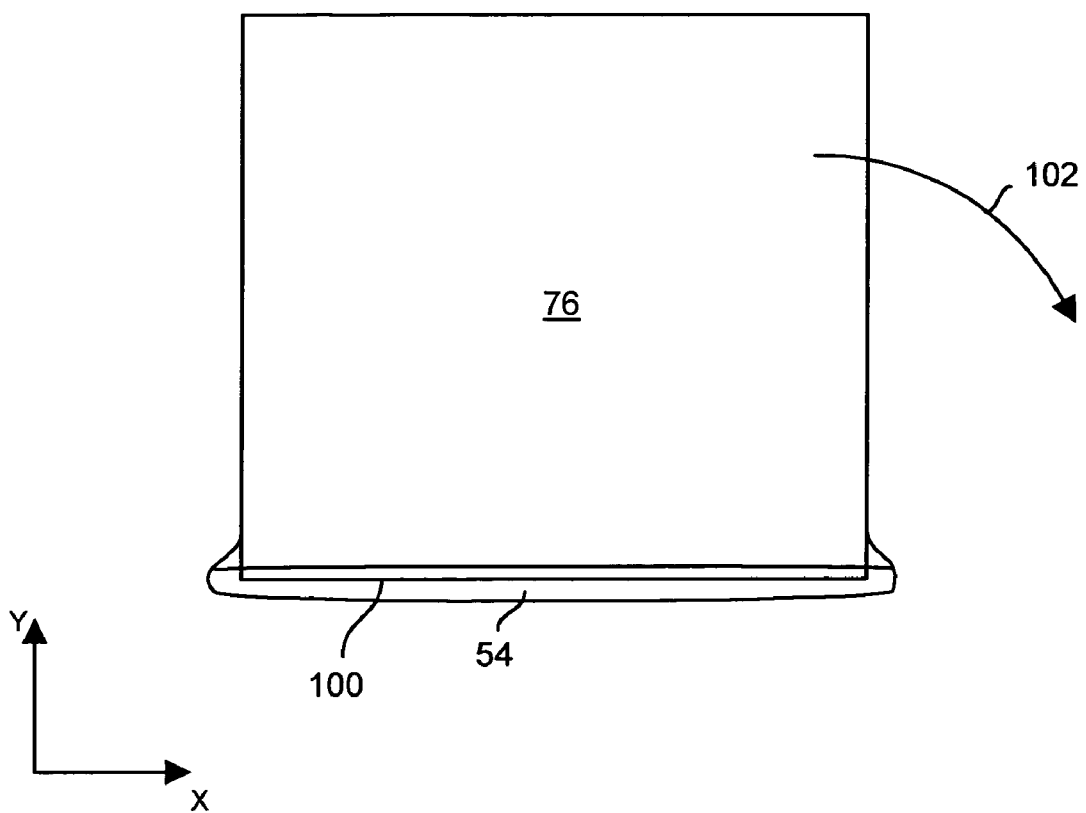
FIG. 5 is a perspective view of a circuit board component of a circuit board shortly after exiting a rinsing subsystem of the circuit board processing system of FIG. 1 when that circuit board resides at a first angle so that a bottom edge of that circuit board resides substantially parallel to a floor surface.

FIG. 5 shows a component 76 of one of the circuit boards 64 when the rack 70 of circuit boards 64 has been removed from the rinsing subsystem 24. In one arrangement, the positioning subsystem 26 moves the rack 70 onto a tiltable table of the draining assembly 44. As such, the bottom edges of the circuit boards 64 are substantially parallel to the floor surface (i.e., the bottom edges are parallel to the X-axis which is perpendicular to the direction of gravity). Since manufacturers traditionally mount components which their edges parallel to the edges of the circuit boards, a bottom edge 100 of the component 76 is substantially parallel to the floor surface (i.e., the X-axis) as well. Accordingly, after a substantial amount of the rinsing fluid drips off and/or flows away from the component 76, the residual rinsing fluid 54 on the component 76 tends to collect along the bottom edge 100 of the component 76. The actual amount of rinsing fluid 54 is based on a variety of factors such as the natural surface tension of the rinsing fluid 54 (e.g., de-ionized water), the size and thickness of the component package, the material of the component package, temperature, the presence of any chemistries in the rinsing fluid 54 (e.g., surfactants), etc.

In many situations, it is advantageous to circuit board manufacturers to remove as much of the residual rinsing fluid 54 as possible. For example, a manufacturer may want to electrically test the circuit boards 64 as quickly as possible to minimize manufacturing time, and thus want to run the circuit boards 64 through a drying assembly to dry the circuit boards 64. However, due to the surface tension of the rinsing fluid 54 (as well as other factors as explained above), a substantial amount of rinsing fluid 54 may remain attached to the component 76 and thus a significant amount of energy and time would be required to thoroughly dry each circuit board 64 in its current state.

To reduce the amount of rinsing fluid 54 remaining on the circuit boards 64, the draining assembly 44 tilts the rack 70 of circuit boards 64 at an angle about the Z-axis to drain additional rinsing fluid 54 from the circuit boards 64 in the direction of the arrow 102. As the rack 70 of circuit boards 64 tilts so does each component 76 mounted to the surfaces 78 of the circuit boards 64. In the arrangement in which the rack 70 resides on a tiltable table, the tiltable table slopes or rotates to one side thus tilting the rack 70. The tiltable table is preferably configured with a retaining edge to prevent the rack 70 from sliding off of the tiltable table.

The draining assembly 44 tilts the rack so that the bottom edges of the circuit boards 64 moves from a first angle which is substantially parallel to the floor surface to a second angle in which the bottom edges of the circuit boards 64 reside substantially at a non-parallel orientation to the floor surface for a predetermined amount of time (e.g., one to three seconds). Although even a modest angle facilitates further draining, a preferable range for the second angle is between 30 degrees and 60 degrees relative to the floor surface. It should be understood that the circuit boards 64 are still in the rack 70 and thus move together from the first angle to the second angle simultaneously. In one arrangement, the second angle is substantially 45 degrees and the amount of time that the draining assembly 44 holds the rack 70 at the second angle is for an appropriate "dwell time" in order to give the residual rinsing fluid 54 enough time to drain from the circuit boards 64. In one arrangement, the dwell time is predefined as the worst case amount of time necessary to drain a particular circuit board design (e.g., at least one second, at least three seconds, at least five seconds, etc.).

Figure 6:
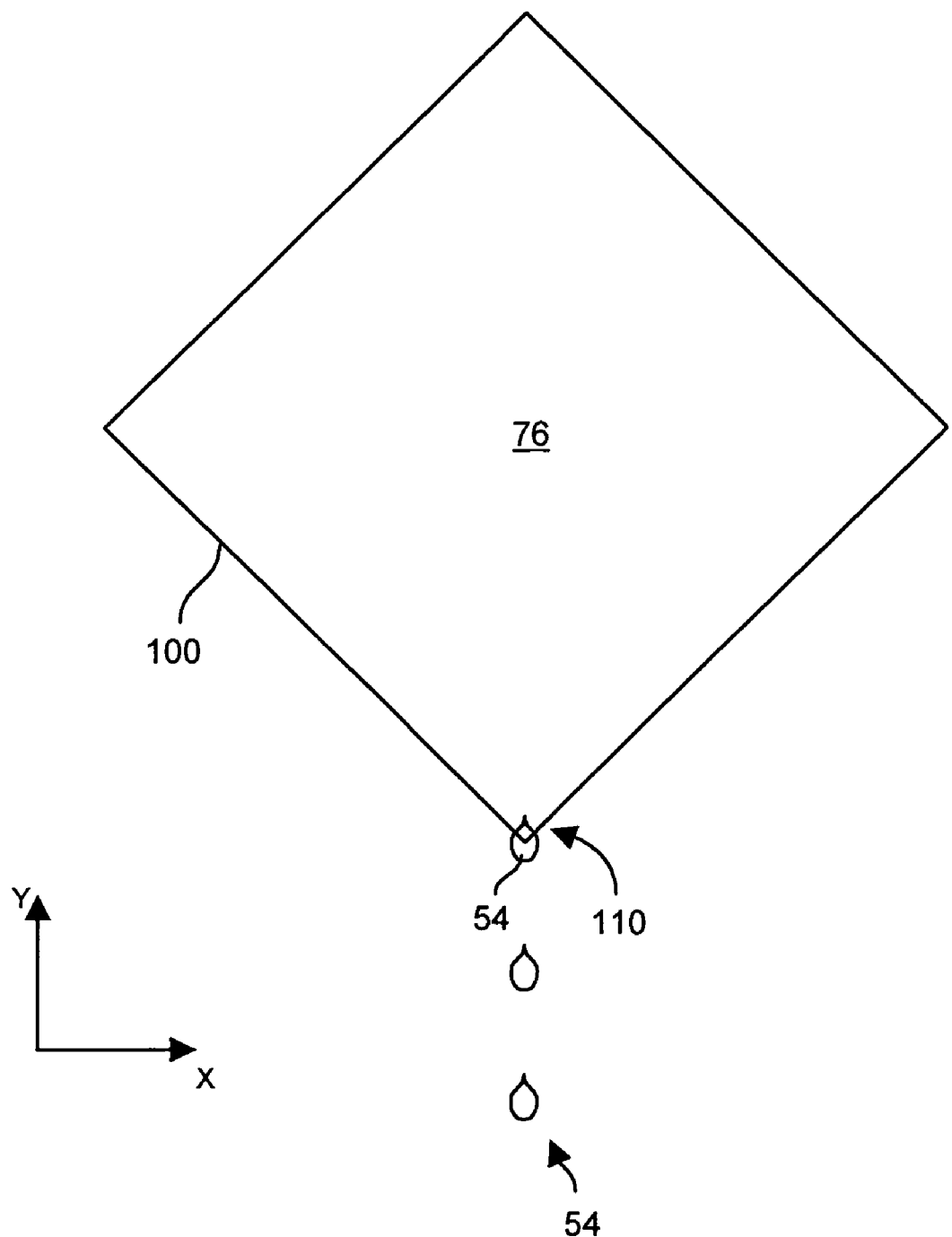
FIG. 6 is a perspective view of the circuit board component of FIG. 5 when the circuit board moves from the first angle to a second angle in which the bottom edge of the circuit board resides substantially at 45 degrees relative to the floor surface.

FIG. 6 shows the component 76 of FIG. 5 after the component 76 has been turned to a 45 degree angle by the draining assembly 44 of the positioning subsystem 26. Here, the lowest point is a corner 110 of the component 76. Accordingly, gravity draws the residual rinsing fluid 54 to the component corner 110. Since there is less component surface area to support and retain the residual rinsing fluid 54 at the corner 110, a substantial amount of the residual rinsing fluid 54 drains off of the component 76, e.g., see the drops 112 falling away from the component 76. This situation occurs for each component 76 as well as for the circuit board 64 itself. Moreover, if there were any components 76 that were not mounted with its edges parallel to the circuit board 64, that component 76 has likely rotated through an angle that provided a corner as the lowest point in order to drain that component 76 of excess rinsing fluid 54 thus encountering improved draining. Furthermore, in some situations, special components (e.g., connectors with cavities or recesses) will have an opportunity to empty themselves of retained rinsing fluid 54 as a result of being rotated from the first angle to the second angle thus removing such fluid 54.

Next, the draining assembly 44 returns the rack 70 of circuit boards 64 to the first angle and its normal orientation (e.g., see FIG. 2). For example, the tiltable table tilts back in the opposite direction to its initial position. At this point, the rack 70 has been thoroughly drained of excess rinsing fluid 54. Since there is now less residual rinsing fluid 54 than just prior to this tilting cycle, there is now less energy and time required to run the circuit boards 64 through a drying process. Thus, the tilting feature saves the circuit board manufacturer additional time and money (e.g., less drying energy). From the tiltable table, the user can slide the rack 70 back onto a portable cart and move the rack 70 to another portion of the circuit board manufacturing process (e.g., a drying assembly).

It should be understood that, although the above-provided explanation described one rack 70 of circuit boards 64 passing through the circuit board processing system 20, the system 20 is capable of processing multiple racks 70 of circuit boards 64 concurrently as shown in FIG. 1. That is, while the rinsing subsystem 24 rinses a first rack 70 of circuit boards 64 in the secondary rinse tank 36 (e.g., the set of circuit boards 66-A), the rinsing subsystem 24 is capable of rinsing a second rack 70 of circuit boards 64 in the primary rinse tank 34 (e.g., the set 66-B of circuit boards 64) and the washing subsystem 22 is capable of washing a third rack 70 of circuit boards 64 in the wash tank 30 (e.g., the set 66-C of circuit boards 64). Such concurrent processing of the racks 70 of circuit boards 64 provides increased throughput which is superior to conventional in-line approaches that process one circuit board at a time, and conventional batch cleaning approaches which process one set of circuit boards at a time.

For such concurrent processing, the positioning subsystem 26 is configured to move the racks 70 of circuit boards 64 through the system in a lock step, pipelined manner. In particular, as the positioning controller 40 lowers the carrier 42 (see FIG. 1) to pick up a new set 66-D of circuit boards 64 from an input location (e.g., a platform adjacent the wash tank 30), the positioning controller 40 also lowers other portions of the carrier 42 over the tanks 30, 34, 36 to pick up the sets 66-C, 66-B, 66-A of circuit boards 64. The carrier 42 (under direction of the positioning controller 40) then moves the sets 66-D, 66-C, 66-B, 66-A simultaneously through the system 20 so that each set 66-D, 66-C, 66-B, 66-A enters its next processing stop in the pipeline. Accordingly, the amount of time that each set 66 of circuit boards 64 remains at a particular location in the system 20 should be equal (e.g., nine minutes in each tank 30, 34, 36).

It should be understood that the electronics of the system 20 are preferably configured to sense and coordinate operations of each subsystem. For example, if the user fails to remove a rack 70 of circuit boards 64 from the draining assembly 44 upon completion of the processing cycles, the system 20 waits for the user to remove the rack 70 from draining assembly 44 before enabling the user reactivate the system 20, i.e., before responding to a new button press by the user. Accordingly, such sensing and feedback coordination prevents the system 20 from inadvertently attempting to pickup and move the racks 70 through the pipeline and perhaps damaging a rack 70 of circuit boards 64 awaiting removal from the system 20.

It should be further understood that the ventilation subsystem 28 continues operating throughout. In particular, the fan assembly 50 continues to draw any escaping vapors 62 from the tanks 30, 34, 36 through the single ventilation duct 48 thus preventing fumes from accumulating within the system 20 and perhaps reaching the user. Furthermore, the system 20 leverages off of a single set of equipment (i.e., a single set of fans) to reduce costs but still provide thorough and reliable vapor removal. As noted earlier, the removable planar-shaped barrier 46 blocks the vapors 62 from directly reaching the user in a zero-exposure type fashion, but still allows the user to access interior portions of the system 20 (e.g., the tanks 30, 34, 36) when necessary (e.g., periodic maintenance). A summary of the operation of system 20 will now be provided with reference to FIG. 7.

Figure 7:
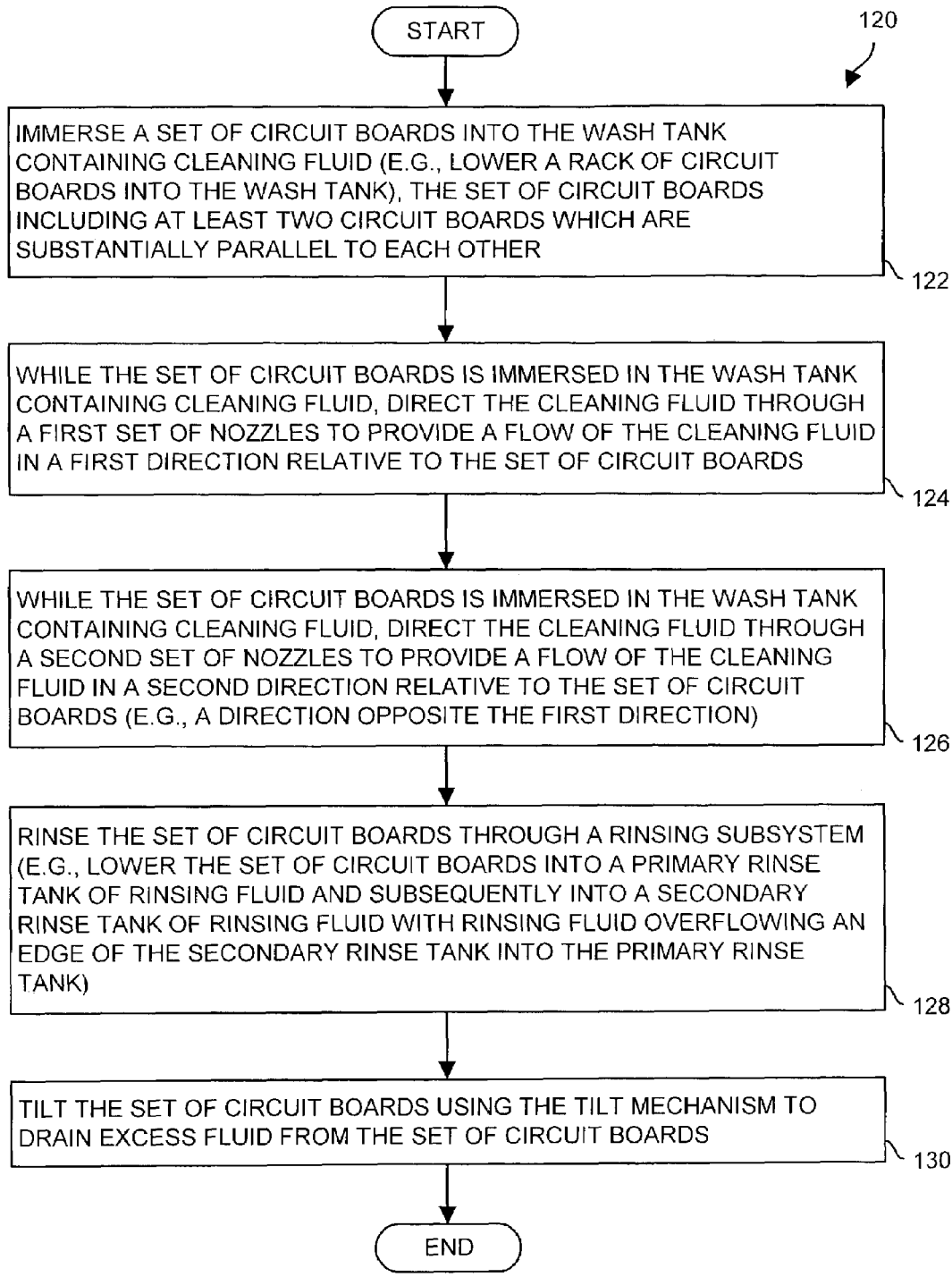
FIG. 7 is a flowchart of a procedure which is performed by the circuit board processing system of FIG. 1 when processing a rack of circuit boards.

FIG. 7 is a flowchart of a procedure 120 which is performed by the circuit board processing system 20 when processing a rack 70 of circuit boards 64 (FIG. 2). In step 122, the system 20 immerses the rack 70 of circuit boards 64 into the wash tank 30 of cleaning fluid 52. In particular, the positioning subsystem 26 moves the rack 70 of circuit boards 64 from an input location adjacent the washing subsystem 22 (i.e., where the user initially places the rack 70) into the wash tank 30 which is already filled with cleaning fluid 52. The vertical orientations of the circuit boards 64 encourages air to escape from the narrow spaces between the components 76 and the circuit board surfaces 78.

In step 124, while the rack 70 remains immersed in the wash tank 30, the flow control assembly 32 directs the cleaning fluid 54 through the first set of nozzles 82 disposed within the wash tank 30 (also see FIGS. 1 and 3). Such operation provides a flow of the cleaning fluid 54 in the first direction 90 relative to the circuit boards 64 thus removing contaminants (e.g., soldering residues, organic materials, etc.) from the circuit boards 64.

In step 126, while the rack 70 still remains immersed in the wash tank 30, the flow control assembly 32 directs the cleaning fluid 54 through the second set of nozzles 86 disposed within the wash tank 30 (FIG. 4). Such operation provides a flow of the cleaning fluid 54 in the second direction 92 relative to the circuit boards 64 thus further removing contaminants from the circuit boards 64. In particular, any neutral point areas that existed during step 124 (see the dashed oval 94 in FIGS. 3 and 4) likely do not exist during step 126 due to the difference in locations of the second set of nozzles 86 and the non-homogeneity of the circuit boards 64.

In step 128, the rinsing subsystem 24 rinses the rack 70 of circuit boards 64. Here, the positioning subsystem 26 moves the rack 70 through the primary and secondary rinse tanks 34, 36 to flush the circuit boards with rinsing fluid 54. Accordingly, any remaining contaminants (e.g., contaminants that are perhaps suspended within residual cleaning fluid 52) are rinsed away. It should be understood that, while the rack 70 of circuit boards 64 passes through the rinsing subsystem 24, the system 20 is capable of processing other racks 70 of circuit boards 64 concurrently.

In step 130, the draining assembly 44 (e.g., a tiltable table) tilts the rack 70 of circuit boards 64 to drain excess fluid from the circuit boards 64. As a result, the rack 70 of circuit boards 64 is now ready for a subsequent process (e.g., drying). Further details of the invention will now be provided with reference to FIG. 8.

Figure 8:
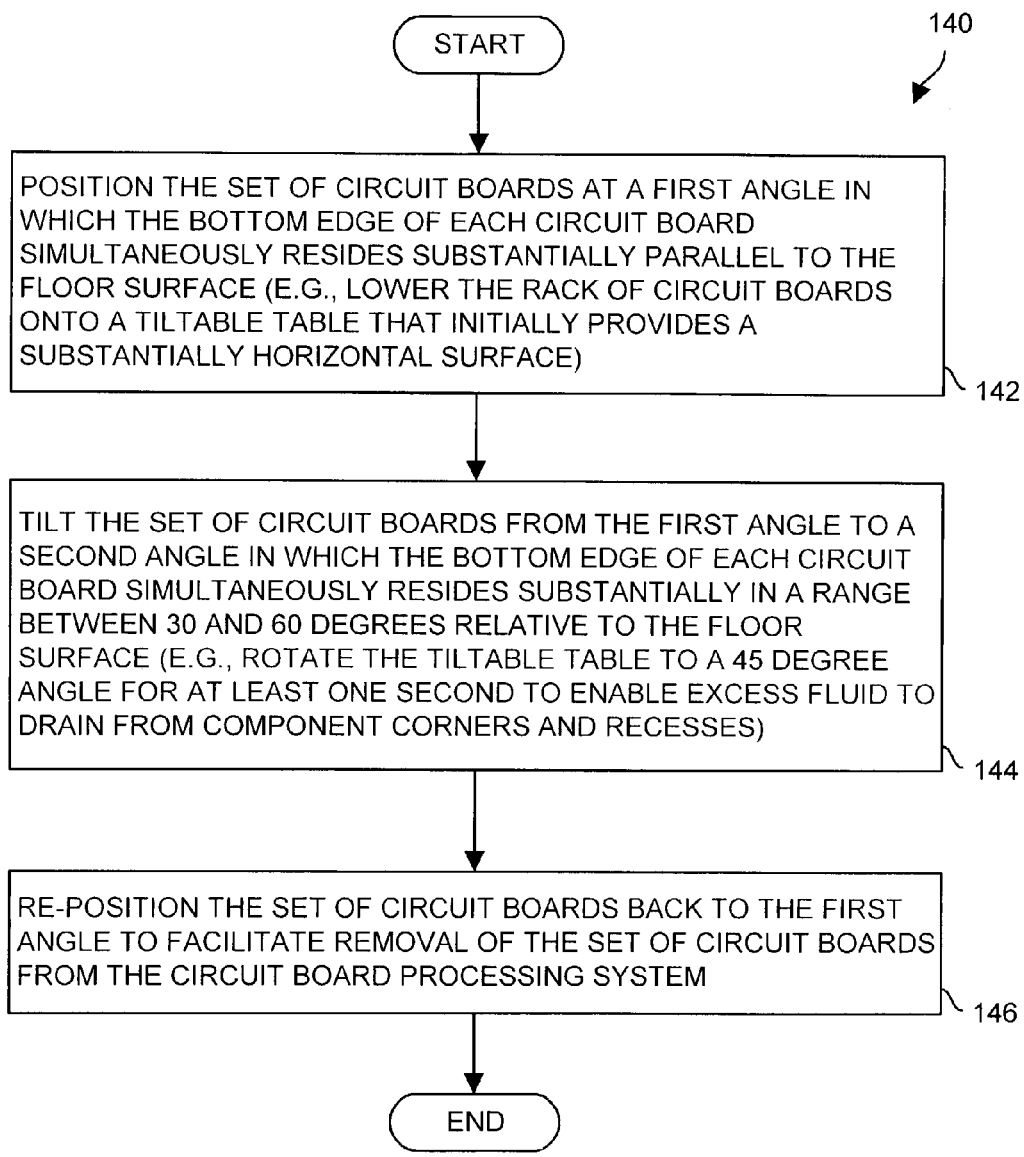
FIG. 8 is a flowchart of a procedure which is suitable for use as a tilting step of the procedure of FIG. 7.

FIG. 8 is a flowchart of a procedure 140 performed by the circuit board processing system 20 which is suitable for use as the tilting step 130 of the procedure 120 of FIG. 7. This procedure 140 may employ a tiltable platform such as a tilt table which supports the rack 70 of circuit boards 64 thereon, or alternative structures such as actuation of robotics while the rack 70 of circuit boards 64 is suspended from the carrier 42 (e.g., a hoist assembly).

In step 142, the system 20 positions the rack 70 of circuit boards 64 at a first angle in which the bottom edge of each circuit board 64 simultaneously resides substantially parallel to the floor surface (also see FIGS. 2 and 5). At this point, the majority of residual fluid tends to reside along the bottom edges of the components 76 and the circuit boards 64 (FIG. 5).

In step 144, the system 20 tilts the rack 70 of circuit boards 64 from the first angle (i.e., zero degrees from the floor surface) to a second angle in which the bottom edge of each circuit board 64 is no longer substantially parallel to the floor surface to encourage excess residual fluid to drain from the circuit boards 64 (see FIG. 6). In particular, the system 20 tilts the rack 70 to an angle within a range of 30 to 60 degrees relative to the floor surface. In one arrangement, the system 20 tilts the rack 70 to a substantially 45 degree angle relative to the floor surface for at least one second (e.g., a period of one to three seconds to allow for significant drainage).

In step 146, the system 20 tilts the rack 70 of circuit boards 64 back to the first angle. At this point, the user can remove the rack 70 from the system 20 for further processing. The circuit boards 64 have been drained of excess fluid and now require less energy and time for a drying assembly to remove the remaining fluid vis-à-vis conventional approaches which do not tilt the circuit boards and thus tend to leave more fluid the circuit boards.

As described above, the invention is directed to circuit board processing techniques which involve cleaning circuit boards 64 by providing a first flow of cleaning fluid 52 (e.g., aqueous solvent) in a first direction 90 relative to the circuit boards 64 and subsequently a second flow of the cleaning fluid 52 in a second direction 92 relative to the circuit boards 64, while the circuit boards 64 are submerged in a wash tank 30 containing the cleaning fluid 52. The multiple flows of cleaning fluid 52 reduce or even eliminate the likelihood of forming neutral points within the tank of cleaning fluid 52. In particular, if the flow in the first direction 90 results in a neutral point at a particular circuit board location 94, the chance is extremely remote that the flow in the second direction 92 (e.g., a direction opposite the first direction 90) will form a similar neutral point at the same location 94. Rather, the turbulence caused by the different flows, as well as the changing of the flows in the different directions 90, 92, results in more-effective circuit board cleaning than conventional cleaning approaches, e.g., a conventional batch cleaning approach where a pair of nozzles provides a flow from one side of a tub to the other side of the tub past circuit boards in a single direction. Furthermore, use of the tank 30 of cleaning fluid 52 provides less volatilization of the cleaning fluid 52 than a conventional in-line spray approach thus conserving the cleaning fluid for subsequent use on other circuit boards. Moreover, the techniques of the invention enable cleaning of multiple circuit boards 64 simultaneously thus providing more throughput than conventional in-line approaches which clean circuit boards one at a time. Such techniques thus provide better cleaning results as well as higher capacity than conventional approaches in use today.

While this invention has been particularly shown and described with references to preferred embodiments thereof, it will be understood by those skilled in the art that various changes in form and details may be made therein without departing from the spirit and scope of the invention as defined by the appended claims.

For example, the circuit board processing system 20 was described above as tilting the racks 70 of circuit boards 64 after the racks 70 finally exit the rinsing subsystem 24. In other arrangements, the racks 70 are tilted more often such as after exiting each tack 30, 34, 36. As a result, more fluid is drained from each circuit board 64 thus introducing less contamination into the next tank 34, 36 in the pipeline.

Additionally, it should be understood that the particular positioning of the different sets of nozzles 82, 86 within the wash tank 30 were provided by way of example only. In other arrangements, the particular locations of the sets of nozzles 82, 86 and/or the rack 70 of circuit boards 64 within the wash tank 30 is different. For example, another set of nozzles could be placed at the bottom of the wash tank 30 for an additional cleaning direction. As another example, the rack 70 could be rotated by the positioning subsystem 26 (e.g., about the Z-axis in FIG. 2) to enable the sets of nozzles 82, 86 to direct cleaning fluid 52 at different angles relative to the circuit boards 64.

Furthermore, it should be understood that other devices can be added to the system 20 to enhance the operation of the system 20. For example, one or more additional cleaning devices could be added to the flow control assembly 32 to supplement the operation of the washing subsystem 22 (e.g., an ultrasonic vibration device, a fluid pulsing device, etc.).

As another example, the carrier 42 could be configured to provide a gentle shake in a horizontal or vertical direction to dislodge excess fluid from the circuit boards 64 immediately after the circuit boards 64 exit the tanks 30, 34, 36. As yet another example, the carrier 42 could work in combination with an air knife assembly that blows fluid off of the circuit boards 64. The excess fluid could then simply drop back into the respective tanks 30, 34, 36 and be recycled through the filtering and pumping equipment.

Additionally, unlike conventional batch cleaners which typically use mild soaps and additives as the aqueous solvents, the circuit board processing system 20 enables the user, if desired, to use stronger and perhaps more hazardous cleaning materials since the automated operation (e.g., the use of the planar-shaped barrier 46 in combination with other doors and lids) prevents the user from direct exposure to the cleaning fluid 52. Accordingly, the system 20 provides the user with more flexibility and choices for the cleaning fluid 52 than the conventional batch cleaning approach.

Moreover, due to the automated nature of the system 20, the user is capable of programming the system 20 to perform a variety of cleaning and rinsing cycles. For example, the user can simply change the order, time and frequency of cleaning and rinsing cycles by simply entering new values into the electronics of the system 20 (e.g., through a keypad). Such modifications and enhancements are intended to belong to various embodiments of the invention.

What is claimed is:

1. A circuit board processing system, comprising:
   a wash tank configured to contain cleaning fluid;
   a positioning subsystem configured to immerse a set of circuit boards into the wash tank when the wash tank contains the cleaning fluid and configured to dispose the set of circuit boards in the wash tank such that the circuit board component mounting surfaces of the circuit boards are substantially parallel to a flow of cleaning fluid produced by a flow control subsystem, the set of circuit boards including at least two circuit boards, the circuit boards being substantially parallel to each other when immersed into the wash tank; and
   the flow control subsystem having (i) a first set of nozzles disposed within the wash tank, (ii) a second set of nozzles disposed within the wash tank, and (iii) a controller which is configured to:
   while the set of circuit boards is immersed in the wash tank containing the cleaning fluid, direct the cleaning fluid through the first set of nozzles to provide a flow of the cleaning fluid in a first direction relative to the set of circuit boards, and after providing the flow of the cleaning fluid in the first direction and while the set of circuit boards is immersed in the wash tank containing the cleaning fluid, direct the cleaning fluid through a second set of nozzles to provide a flow of the cleaning fluid in a second direction relative to the set of circuit boards;
   wherein:
   the first set of nozzles disposed within the wash tank comprises a first set of nozzles disposed within the wash tank on a first side of the wash tank,
   the second set of nozzles disposed within the wash tank comprises a second set of nozzles disposed within the wash tank, on a second side of the wash tank, the second side of the wash tank opposing the first side of the wash tank,
   when directing the cleaning fluid through the first set of nozzles, the controller is configured to, while the set of circuit boards is immersed in the wash tank containing the cleaning fluid, direct the cleaning fluid through the first set of nozzles to provide the flow of the cleaning fluid in the first direction relative to the set of circuit boards, the first direction of the flow from the first set of nozzles being substantially parallel to the circuit board component mounting surface of the circuit board and being directed from the first side of the wash tank to the second side of the wash tank, and
   when directing the cleaning fluid through the second set of nozzles, the controller is configured to, after providing the flow of the cleaning fluid in the first direction and while the set of circuit boards is immersed in the wash tank containing the cleaning fluid, direct the cleaning fluid through the second set of nozzles to provide the flow of the cleaning fluid in a second direction relative to the set of circuit boards, the second direction of the flow from the second set of nozzles substantially parallel to the circuit board component mounting surface of the circuit board and being directed from the second side of the wash tank to the first side of the wash tank, the second direction of the flow substantially opposing the first direction of the flow along a common axis.

2. The circuit board processing system of claim 1 wherein the set of circuit boards is disposed within in a rack to form a rack of circuit boards, and wherein the positioning subsystem is configured to lower the rack of circuit boards into a position within the wash tank that is between the first set of nozzles and the second set of nozzles.

3. The circuit board processing system of claim 2 wherein the positioning subsystem is further configured to (i) raise the rack of circuit boards out of the wash tank containing the cleaning fluid, and (ii) lower the rack of circuit boards into a rinse tank containing rinsing fluid.

4. The circuit board processing system of claim 3 wherein the positioning subsystem is further configured to:
   when lowering the rack of circuit boards into the rinse tank, simultaneously lower another rack of circuit boards into the wash tank to process multiple racks of circuit boards in a pipelined manner.

5. The circuit board processing system of claim 2, further comprising:
   a primary rinse tank disposed adjacent to the wash tank; and
   a secondary rinse tank dispose adjacent to the primary rinse tank, wherein the secondary rinse tank is configured to contain rinsing fluid which overflows an edge of the secondary rinse tank into the primary rinse tank, and wherein the positioning subsystem is configured to move the rack of circuit boards out of the wash tank and into the primary rinse tank, and subsequently out of the primary rinse tank and into the secondary rinse tank.

6. The circuit board processing system of claim 5, further comprising:
   a ventilation subsystem coupled to the wash tank, the primary rinse tank and the secondary rinse tank, wherein the ventilation subsystem includes (i) a single ventilation duct and (ii) a fan assembly which is configured to ventilate vapors emanating from the wash tank, the primary rinse tank, and the secondary rinse tank through the single ventilation duct to simultaneously remove vapors from the wash tank, the primary rinse tank and the secondary rinse tank.

7. The circuit board processing system of claim 6, further comprising:

a planar-shaped barrier coupled to the wash tank, the primary rinse tank, and the secondary rinse tank, wherein the planar-shaped barrier is configured to define at least a portion of (i) an enclosed wash tank space above the wash tank, (ii) an enclosed primary rinse tank space above the primary rinse tank, and (iii) an enclosed secondary rinse tank space above the secondary rinse tank, and wherein the ventilation subassembly is configured to simultaneously draw the vapors from the enclosed wash tank space above the wash tank, the enclosed primary rinse tank space above the primary rinse tank, and the secondary rinse tank space above the secondary rinse tank.

8. The circuit board processing system of claim 1, further comprising:
   a draining assembly configured to tilt the set of circuit boards from a first angle in which the bottom edge of each circuit board simultaneously resides substantially parallel to a floor surface to a second angle in which the bottom edge of each circuit board simultaneously resides substantially in a range between 30 degrees and 60 degrees relative to the floor surface.

9. The circuit board processing system of claim 8 wherein the set of circuit boards is disposed within in a rack to form a rack of circuit boards, and wherein the draining assembly, when tilting the set of circuit boards, is configured to:
   position the rack to orient the bottom edge of each circuit board at the second angle for at least one second.

10. The circuit board processing system of claim 8 wherein the set of circuit boards is disposed within in a rack to form a rack of circuit boards, and wherein the draining assembly, when tilting the set of circuit boards, is configured to:
   hold the rack still to orient the bottom edge of each circuit board at substantially 45 degrees relative to the floor surface.

11. The circuit board processing system of claim 1, wherein:
   when directing the cleaning fluid through the first set of nozzles to provide the flow of the cleaning fluid in the first direction relative to the set of circuit boards, at a first time, the controller is further configured to (i) actuate a first set of valves associated with the first set of nozzles to an open position and (ii) actuate a second set of valves associated with the second set of nozzles to a closed position to direct the cleaning fluid from the first side of the wash tank to the second side of the wash tank; and
   when directing the cleaning fluid through the second set of nozzles to provide the flow of the cleaning fluid in the second direction relative to the set of circuit boards, at a second time, the controller is further configured to (i) actuate the first set of valves associated with the first set of nozzles to a closed position and (ii) actuate the second set of valves associated with the second set of nozzles to an open position to direct the cleaning fluid from the second side of the wash tank to the first side of the wash tank, the second time being subsequent to the first time.

12. The circuit board processing system of claim 1, further comprising:
   a pump assembly electrically coupled to the controller;
   a filter assembly disposed in series with the pump assembly, the filter assembly configured to filter solid material from the cleaning fluid;
   when directing the cleaning fluid through the first set of nozzles, the controller is configured to, while the set of circuit boards is immersed in the wash tank containing the cleaning fluid, operate the pump assembly to draw the cleaning fluid through the filter assembly and direct the cleaning fluid through the first set of nozzles to provide the flow of the cleaning fluid in the first direction relative to the set of circuit boards, the first direction of the flow from the first set of nozzles being substantially parallel to the circuit board component mounting surface of the circuit board and being directed from the first side of the wash tank to the second side of the wash tank; and
   when directing the cleaning fluid through the second set of nozzles, the controller is configured to, after providing the flow of the cleaning fluid in the first direction and while the set of circuit boards is immersed in the wash tank containing the cleaning fluid, continue to operate the pump assembly to draw the cleaning fluid through the filter assembly and direct the cleaning fluid through the second set of nozzles to provide the flow of the cleaning fluid in a second direction relative to the set of circuit boards, the second direction of the flow from the second set of nozzles substantially parallel to the circuit board component mounting surface of the circuit board and being directed from the second side of the wash tank to the first side of the wash tank, the second direction of the flow substantially opposing the first direction of the flow along a common axis.

13. The circuit board processing system of claim 8, wherein the floor surface is perpendicular to a direction of gravitational force exerted on the set of circuit boards.

14. The circuit board processing system of claim 1, wherein the positioning subsystem is operable to transfer multiple sets of circuit boards through the circuit board processing system in a substantially synchronous, locked-step manner.

15. The circuit board processing system of claim 14, wherein the carrier comprises an assembly of hoists, the assembly of hoists operable to synchronously convey a set of circuit boards from a first position over a first tank to a second position over a second tank in the substantially synchronous, locked-step manner.

* * * * *